(12) United States Patent
Park et al.

(10) Patent No.: US 8,247,162 B2
(45) Date of Patent: Aug. 21, 2012

(54) METHODS OF FORMING A PATTERN USING PHOTORESIST COMPOSITIONS

(75) Inventors: Ji-Man Park, Hwaseong-si (KR); Young-Ho Kim, Yongin-si (KR); Hyo-Jin Yun, Anyang-si (KR); Sun-Yul Ahn, Seoul (KR); Song-Se Yi, Seoul (KR); Kyung-Woo Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 277 days.

(21) Appl. No.: 12/662,455

(22) Filed: Apr. 19, 2010

(65) Prior Publication Data

US 2010/0266966 A1 Oct. 21, 2010

(30) Foreign Application Priority Data

Apr. 20, 2009 (KR) ........................ 10-2009-0034066

(51) Int. Cl.
*G03F 7/004* (2006.01)
*G03F 7/30* (2006.01)

(52) U.S. Cl. ..................... 430/270.1; 430/326; 430/907; 430/910

(58) Field of Classification Search ............... 430/270.1, 430/326, 907, 910
See application file for complete search history.

(56) References Cited

U.S. PATENT DOCUMENTS

| | | | |
|---|---|---|---|
| 5,225,316 A * | 7/1993 | Vogel et al. ................ | 430/270.1 |
| 7,195,863 B2 | 3/2007 | Takano et al. | |
| 7,378,215 B2 | 5/2008 | Yamaguchi et al. | |
| 2004/0137362 A1 * | 7/2004 | De et al. ..................... | 430/270.1 |
| 2008/0193879 A1 | 8/2008 | Allen et al. | |
| 2008/0199805 A1 * | 8/2008 | Rushkin et al. ............ | 430/270.1 |

FOREIGN PATENT DOCUMENTS

| | | |
|---|---|---|
| JP | 2002-006514 A | 1/2002 |
| JP | 2004-002733 A | 1/2004 |
| JP | 2007-163756 A | 6/2007 |

* cited by examiner

*Primary Examiner* — John Chu
(74) *Attorney, Agent, or Firm* — Lee & Morse, P.C.

(57) ABSTRACT

A method of forming a pattern and a photoresist composition, the method including forming a photoresist film on a substrate by coating a photoresist composition thereon, the photoresist composition including a polymerized photoresist additive, a polymer including an acid-labile protective group at a side chain, a photoacid generator, and a solvent; exposing the photoresist film; and forming a photoresist pattern by developing the photoresist film using an aqueous alkali developer, wherein the polymerized photoresist additive includes a hydrophilic repeating unit having an aliphatic hydrocarbon backbone and a side chain containing an oxygen heteroatom in a heterocyclic ring substituted with at least three hydroxyl groups, and a hydrophobic repeating unit having an aliphatic hydrocarbon backbone and a side chain containing a fluorinated aliphatic hydrocarbon group.

10 Claims, 10 Drawing Sheets

METHODS OF FORMING A PATTERN USING PHOTORESIST COMPOSITIONS

BACKGROUND

1. Field

Embodiments relate to photoresist compositions and methods of forming a pattern using the photoresist compositions.

2. Description of the Related Art

An organic photosensitive material, e.g., photoresist, is a material that may be changed physically and/or chemically by light or radiation energy. The organic photosensitive material may be applied to microfabrication technologies, e.g., photolithography, and has been used for manufacturing electronic devices, e.g., integrated circuit (IC) devices, memory devices, printed circuit boards (PCBs), micro electro mechanical systems (MEMS), micromachines, image sensor devices, etc.

In general, resolution of a pattern in a photolithography process may be expressed in the following Equation.

$$R = K1 \times \lambda / NA$$

In the Equation, R is the resolution of the pattern, $\lambda$ is a wavelength of light, NA is a numerical aperture of a lens, and K1 represents a process constant that mostly depends on a material of the pattern. NA may be proportional to a diameter of the lens and inversely proportional to a focal distance of the lens.

If the wavelength becomes shorter or the lens becomes bigger, the resolution of the pattern may become better. Additionally, the resolution may depend on characteristics of the material of the pattern, e.g., a photoresist. For example, the resolution of a photoresist pattern including a polymer may be affected by molecular size of the polymer, degree of chain entanglement, solubility differences between an exposed portion and a non-exposed portion of the photoresist pattern, etc.

SUMMARY

Embodiments are directed to photoresist compositions and methods of forming a pattern using the photoresist compositions, which substantially overcome one or more of the problems due to the limitations and disadvantages of the related art.

It is a feature of an embodiment to provide photoresist compositions having good characteristics.

It is another feature of an embodiment to provide methods of forming a pattern using the photoresist pattern compositions having good characteristics.

At least one of the above and other features and advantages may be realized by providing a method of forming a pattern, the method including forming a photoresist film on a substrate by coating a photoresist composition thereon, the photoresist composition including a polymerized photoresist additive, a polymer including an acid-labile protective group at a side chain, a photoacid generator, and a solvent; exposing the photoresist film; and forming a photoresist pattern by developing the photoresist film using an aqueous alkali developer, wherein the polymerized photoresist additive includes a hydrophilic repeating unit having an aliphatic hydrocarbon backbone and a side chain containing an oxygen heteroatom in a heterocyclic ring substituted with at least three hydroxyl groups, and a hydrophobic repeating unit having an aliphatic hydrocarbon backbone and a side chain containing a fluorinated aliphatic hydrocarbon group.

The polymerized photoresist additive may be represented by Chemical Formula 1 or 2,

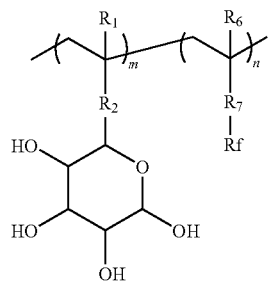

(1)

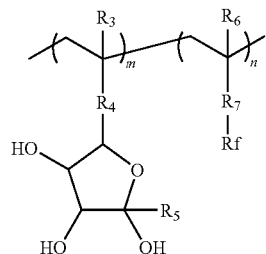

(2)

wherein, in Chemical Formulae 1 and 2, $R_1$, $R_3$, and $R_6$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group, $R_2$, $R_4$, and $R_7$ may each independently be a divalent chain functional group including at least one of a $C_2$-$C_6$ carbonyloxyalkylene group, a $C_1$-$C_6$ alkylene group, a $C_1$-$C_6$ alkyleneoxy group, a $C_1$-$C_6$ oxyalkylene group, a $C_1$-$C_6$ carbonyl group, an oxy group, a $C_1$-$C_6$ carbonyloxy group, a $C_1$-$C_6$ oxycarbonyl group, a $C_2$-$C_6$ carbonylalkylene group, and a $C_2$-$C_6$ alkylenecarbonyl group, $R_5$ may be hydrogen, a $C_1$-$C_4$ hydroxyalkyl group, a $C_1$-$C_4$ alkoxy group, or a $C_1$-$C_4$ alkyl group, Rf may be a $C_1$-$C_4$ fluoroalkyl group, a $C_1$-$C_4$ perfluoroalkyl group, or an aliphatic hydrocarbon group having at least one of a fluoroalkyl group and a perfluoroalkyl group as a substituent group, and $0<m<1$, $0<n<1$, and $0<m+n\leq1$.

The polymerized photoresist additive may be represented by Chemical Formula 3 or 4,

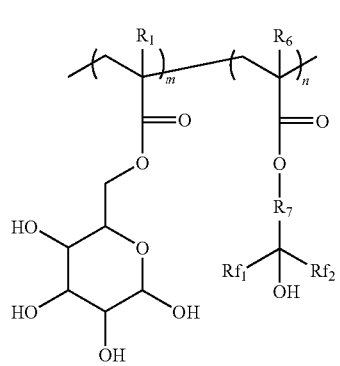

(3)

-continued

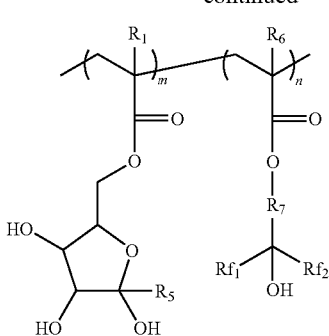

(4)

wherein, in Chemical Formulae 3 and 4, $R_1$ and $R_6$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group, $R_5$ may be hydrogen or a $C_1$-$C_4$ hydroxyalkyl group, $R_7$ may be a $C_1$-$C_{10}$ alkylene chain, and $Rf_1$ and $Rf_2$ may each independently be a $C_1$-$C_4$ fluoroalkyl or a $C_1$-$C_4$ perfluoroalkyl, and $0<m<1$, $0<n<1$, and $0<m+n\leq 1$.

The hydrophilic repeating unit may have a residue of an aliphatic polyol on the side chain, the residue including at least one of glucose, altrose, mannose, gulose, idose, galactose, talose, ribose, arabinose, xylose, licsose, and fructose.

The polymerized photoresist additive may be represented by Chemical Formula 5,

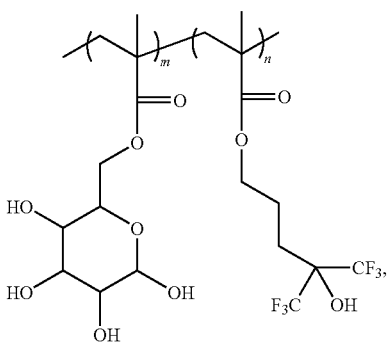

(5)

and
$0<m<1$, $0<n<1$, and $0<m+n\leq 1$.

The repeating units including the acid-labile protective group at the side chain may be included in the polymer in an amount of about 30 mol % to about 60 mol %, based on a total mole number of repeating units of the polymer.

The polymer may include a $C_5$-$C_{20}$ alicyclic hydrocarbon group unsubstituted or substituted with the acid-labile protective group, and the $C_5$-$C_{20}$ alicyclic hydrocarbon group may include at least one of substituted or unsubstituted adamantly, substituted or unsubstituted tricyclodecanyl, substituted or unsubstituted norvinyl, substituted or unsubstituted isobornyl, substituted or unsubstituted cyclopentyl, and substituted or unsubstituted cyclohexyl.

The polymer may include a first repeating unit, a second repeating unit, and a third repeating unit, the first repeating unit having the acid-labile protective group at a side chain, the second repeating unit having a lactone ester group at a side chain, and the third repeating unit having an aliphatic hydrocarbon group substituted with hydroxyl group at a side chain.

The method may further include forming an etch-target layer on the substrate prior to forming the photoresist film; and performing an etching process on the etch-target layer to form an etch-target layer pattern on the substrate using the photoresist pattern as an etching mask.

At least one of the above and other features and advantages may also be realized by providing a photoresist composition including a polymer including an acid-labile protective group at a side chain; a photoacid generator; a solvent; and a polymerized photoresist additive including a repeating unit represented by Chemical Formula 1 or 2,

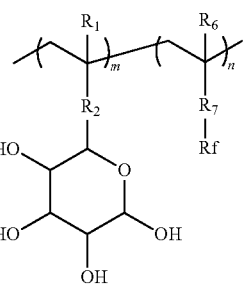

(1)

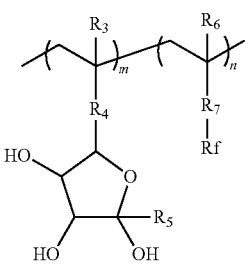

(2)

wherein, in Chemical Formulae 1 and 2, $R_1$, $R_3$, and $R_6$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group, $R_2$, $R_4$, and $R_7$ may each independently be a divalent chain functional group including at least one of a $C_2$-$C_6$ carbonyloxyalkylene group, a $C_1$-$C_6$ alkylene group, a $C_1$-$C_6$ alkyleneoxy group, a $C_1$-$C_6$ oxyalkylene group, a $C_1$-$C_6$ carbonyl group, an oxy group, a $C_1$-$C_6$ carbonyloxy group, a $C_1$-$C_6$ oxycarbonyl group, a $C_2$-$C_6$ carbonylalkylene group, or a $C_2$-$C_6$ alkylenecarbonyl group, $R_5$ may be hydrogen, a $C_1$-$C_4$ hydroxyalkyl group, a $C_1$-$C_4$ alkoxy group, or a $C_1$-$C_4$ alkyl group, and Rf may be a $C_1$-$C_4$ fluoroalkyl group, a $C_1$-$C_4$ perfluoroalkyl group, or an aliphatic hydrocarbon having at least one of a fluoroalkyl group or a perfluoroalkyl group as a substituent group, and $0<m<1$, $0<n<1$, and $0<m+n\leq 1$.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
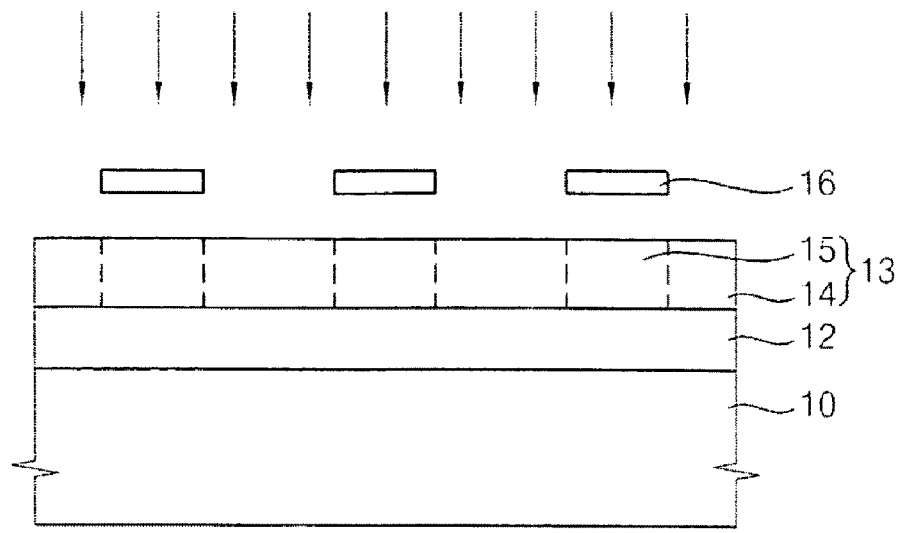
FIGS. 1 and 2 illustrate cross-sectional views of stages in a method of forming a pattern according to an embodiment.

Korean Patent Application No. 10-2009-0034066, filed on Apr. 20, 2009, in the Korean Intellectual Property Office, and entitled: "Photoresist Compositions and Methods of Forming a Pattern Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element or layer is referred to as being "connected to" or "coupled to" another element or layer, it can be directly connected or coupled to the other element or layer or intervening elements or layers may be present. In contrast, when an element is referred to as being "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, however do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In example embodiments, "alkyl" represents linear, branched or ring-shaped saturated hydrocarbon chains, and "alkylene" represents linear, branched or ring-shaped saturated divalent hydrocarbon chains. In an example embodiment, alkyl or alkylene may include 1 to 30 carbon atoms. Alternatively, alkyl or alkylene may include 1 to 10 carbon atoms. Alkyl and alkylene may be substituted with some substituent groups. Alternatively, alkyl and alkylene may be substituted with no substituent groups. Examples of alkyl may include methyl, ethyl, propyl, isopropyl, butyl, t-butyl, cyclohexyl, etc. An "aliphatic" functional group represents linear, branched or a ring-shaped saturated or unsaturated hydrocarbon chains without aromatic ring structure. The aliphatic functional group may be substituted with some substituent groups. Alternatively, the aliphatic functional group may be substituted with no substituent groups. An alicyclic functional group represents a ring-shaped aliphatic functional groups.

Photoresist Compositions

In an embodiment, a photoresist composition may include a polymerized photoresist additive, a polymer including an acid-labile protective group at a side chain, a photoacid generator, and a solvent. The polymerized photoresist additive may include a hydrophilic repeating unit and a hydrophobic repeating unit. The hydrophilic repeating unit may have an aliphatic hydrocarbon backbone and a side chain containing an oxygen heteroatom in a heterocyclic ring substituted with at least three hydroxyl groups. The hydrophobic repeating unit may have an aliphatic hydrocarbon backbone and a side chain containing a fluorinated aliphatic hydrocarbon group.

The photoresist composition may include the polymer including the acid-labile protective group (hereinafter, "polymer") and the polymerized photoresist additive including a side chain group having high hydrophilicity. When the photoresist composition has a high content of the acid-labile protective group, a difference in solubility rates between an exposed portion and a non-exposed portion of a photoresist film including the photoresist composition may increase. Thus, contrast and resolution of the photoresist film may be improved. However, the acid-labile protective group having high hydrophobicity may increase the hydrophobicity of the polymer and the photoresist film. Thus, the photoresist composition may not be removed sufficiently in a rinse process or a development process and may remain on a pattern, thereby generating defects of the pattern or acting as impurities in subsequent processes.

The polymerized photoresist additive (hereinafter, "additive") including the highly hydrophilic side chain may increase a solubility rate of the photoresist composition in water or an aqueous alkali developer. Thus, the pattern defects due to the imperfect removal or re-deposition of the photoresist composition on the pattern may be advantageously reduced or prevented.

The additive may be a kind of surfactant and may include the hydrophilic repeating unit and the hydrophobic repeating unit. The hydrophilic repeating unit may have the side chain containing the heterocyclic ring substituted with at least three hydroxyl groups. Thus, the hydrophilic repeating unit may increase the solubility rate of the photoresist composition in water or an aqueous alkali developer. The hydrophobic repeating unit may have the side chain containing the fluorinated aliphatic hydrocarbon group. Thus, the hydrophobic repeating unit may enclose hydrophobic elements of the photoresist composition, e.g., a hydrophobic polymer, thereby advantageously reducing or preventing the re-deposition of the photoresist composition on the pattern.

The hydrophobic repeating units of the additive may include the aliphatic hydrocarbon backbone. In an implementation, the hydrocarbon backbone may include, e.g., an acrylate-based polymer, a methacrylate-based polymer, a vinyl ester-based polymer, a vinyl ether-based polymer, a vinyl alcohol-based polymer, a vinyl halide-based polymer, an olefin-based polymer, a cyclic olefin-based polymer, a norbornene-based polymer, an unsaturated anhydride-based polymer, etc., but is not limited thereto.

The hydrophilic repeating unit may have an aliphatic polyol residue, e.g., glucose, altrose, allose, mannose, gulose, idose, galactose, talose, ribose, arabinose, xylose, licsose, fructose, etc., at a side chain. The aliphatic polyol may include isomers of the above-listed materials. For example, D-type, L-type, α-type, and β-type isomers of glucose may be included. The hydrophilic repeating unit may have a residue at a side chain, wherein the residue includes, e.g., a hydroxymethyl group included in the aliphatic polyol from which a hydroxyl group is removed.

The polymerized photoresist additive may be represented by Chemical Formula 1 or 2. In Chemical Formulae 1 and 2, a left side represents the hydrophilic repeating unit, and a right side represents the hydrophobic repeating unit.

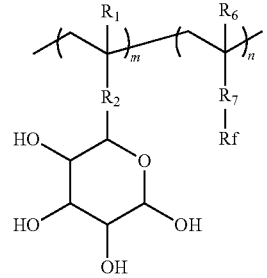

(1)

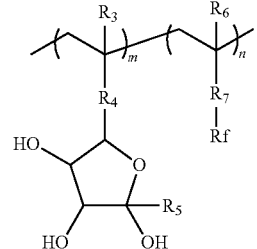

(2)

In Chemical Formulae 1 and 2, $R_1$, $R_3$, and $R_6$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group. $R_2$, $R_4$, and $R_7$ may each independently be a divalent chain functional group including a $C_2$-$C_6$ carbonyloxyalkylene group, a $C_1$-$C_6$ alkylene group, a $C_1$-$C_6$ alkyleneoxy group, a $C_1$-$C_6$ oxyalkylene group, a $C_1$-$C_6$ carbonyl group, an oxy group, a $C_1$-$C_6$ carbonyloxy group, a $C_1$-$C_6$ oxycarbonyl group, a $C_2$-$C_6$ carbonylalkylene group, or a $C_2$-$C_6$ alkylenecarbonyl group. These may be used alone or in combinations thereof. $R_5$ may be hydrogen, a $C_1$-$C_4$ hydroxyalkyl group, a $C_1$-$C_4$ alkoxy group, or a $C_1$-$C_4$ alkyl group. Rf may represent a $C_1$-$C_4$ fluoroalkyl group, a $C_1$-$C_4$ perfluoroalkyl group, or an aliphatic hydrocarbon group. The aliphatic hydrocarbon group may have at least one of a fluoroalkyl group and a perfluoroalkyl group as a substituent group. m and n may satisfy the condition of $0<m<1$, $0<n<1$, and $0<m+n\leq1$.

In an implementation, in Chemical Formulae 1 and 2, $R_1$, $R_3$, and $R_6$ may include, e.g., hydrogen, a methyl group, an ethyl group, a methoxy group, a hydroxymethyl group, a chloromethyl group, etc. $R_2$, $R_4$, and $R_7$ may include, e.g., a carbonyloxymethylene group, a carbonyloxyethylene group, a carbonyloxypropylene group, a carbonyloxybutylene group, a propyleneoxy group, a carbonyloxy group, a carbonylpropylene group, etc. $R_5$ may include, e.g., hydrogen, a hydroxymethyl group, etc. Rf may include, e.g., a fluoromethyl group, a difluoromethyl group, a trifluoromethyl group, a hexafluoroethyl group, a heptafluoropropyl group, a nonafluorobutyl group, a bis(trifluoromethyl)hydroxymethyl group, a bis(hexafluoroethyl)hydroxymethyl group, a bis(trifluoromethyl)hydroxyethyl group, a tris(trifluoromethyl)methyl group, a tris(hexafluoroethyl)methyl group, etc.

m and n represent a relative ratio of the hydrophilic repeating unit and the hydrophobic repeating unit, and may be controlled to improve the hydrophilicity of the photoresist composition and to reduce the pattern defects. m may be about 0.05 to about 0.95, preferably about 0.1 to about 0.9, more preferably about 0.2 to about 0.8, and still more preferably about 0.3 to about 0.7, but is not limited thereto. n may be about 0.05 to about 0.95, preferably about 0.1 to about 0.9, more preferably about 0.2 to about 0.8, and still more preferably about 0.3 to about 0.7, but is not limited thereto.

The additive may have a weight-average molecular weight of about 500 to about 500,000. In an implementation, the additive may have a weight-average molecular weight of about 500 to about 10,000. The molecular weight of the additive may be controlled in consideration of a desired resolution of the photoresist film, a viscosity of the photoresist composition, a contact angle of the photoresist composition relative to an aqueous solvents, the generation of the pattern defects, etc.

In another implementation, the additive may include a main polymer chain of the hydrophilic repeating unit and the hydrophobic repeating and a subsidiary polymer chain of other types of repeating units.

In an implementation, the additive represented by Chemical Formula 1 or 2 may be represented by Chemical Formula 3 or 4.

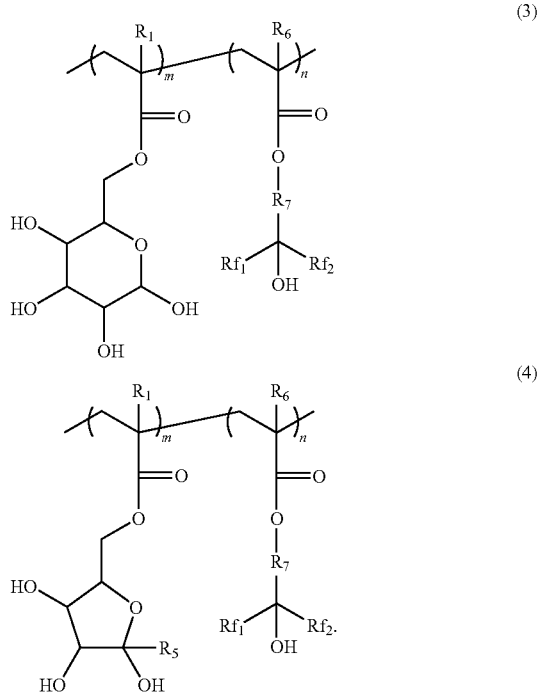

In Chemical Formulae 3 and 4, $R_1$ and $R_6$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group. $R_5$ may be hydrogen or a $C_1$-$C_4$ hydroxyalkyl group. $R_7$ may be a $C_1$-$C_{10}$ alkylene chain. $Rf_1$ and $Rf_2$ may each independently be a $C_1$-$C_4$ fluoroalkyl or a $C_1$-$C_4$ perfluoroalkyl. m and n may satisfy the relations: $0<m<1$, $0<n<1$, and $0<m+n\leq 1$. In an implementation, $R_7$ may include, e.g., methylene, ethylene, propylene, butylene, hexylene, octylene, etc. In an implementation, $Rf_1$ and $Rf_2$ may include, e.g., a fluoromethyl group, a difluoromethyl group, a trifluoromethyl group, a hexafluoroethyl group, a heptafluoropropyl group, a nonafluorobutyl group, etc.

In an implementation, the additive represented by Chemical Formula 1 may be represented by Chemical Formula 5.

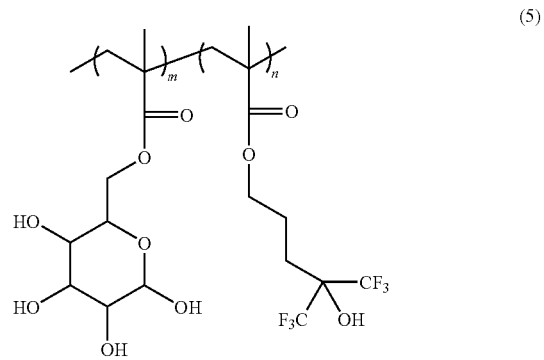

In Chemical Formula 5, m and n may satisfy the relations: $0<m<1$, $0<n<1$, and $0<m+n\leq 1$. The glucose residues substituted at the side chain of the hydrophilic repeating unit may include the isomers thereof, e.g., D-type, L-type, α-type, and β-type.

The additive may be prepared by copolymerization of a monomer of the hydrophilic repeating unit and a monomer of the hydrophobic repeating unit. For example, the additive represented by Chemical Formula 5 may be prepared by mixing a methacrylate monomer substituted with D-glucose and a methacrylate monomer substituted with bis(trifluoromethyl)hydroxybutyl in a solvent followed by radical polymerization using a initiator, e.g., AIBN.

The additive may be included in the photoresist composition in an amount of about 0.001% to about 5% by weight, based on a total weight of the photoresist composition. Maintaining the amount of the additive about 0.001% to about 5% by weight, based on a total weight of the photoresist composition, may help ensure that the photoresist composition has a sufficiently increased solubility rate in water or an aqueous alkali developer. Thus, pattern defects due to imperfect removal of the photoresist composition or re-deposition of the photoresist film on the pattern may be advantageously reduced or prevented. In an implementation, the additive may be included in an amount of about 0.01% to about 1% by weight. The additive may be included in the composition in an amount of about 0.01% to about 10% by weight, based on a total weight of the polymer in the photoresist composition.

The photoresist composition may include the polymer including the acid-labile protective group at the side chain. The acid-labile protective group may represent a functional group that may be separated from the polymer by acid generated from a photoacid generator. In a chemically amplified positive photoresist composition, during a post-exposure baking process, the acid-labile protective group may be separated from the polymer by chemical chain reaction catalyzed by the acid. Thus, exposed portions of the photoresist composition may be easily soluble in a developer.

The polymer may include any suitable material having the acid-labile protective group. The polymer may be selected according to a light source to be used in the development process. In an implementation, the polymer may include, e.g., an acrylate-based, a methacrylate-based, a vinyl ester-based, a vinyl ether-based, a vinyl alcohol-based, a vinyl halide-based, an olefin-based, a cycloolefin-based, a norbornene-based, a polyester-based, a polyamide-based, polycarbonate-based, an anhydride maleate, an unsaturated anhydride-based repeating unit, or a polymer as a main chain. These may be used alone or in combinations thereof.

The acid-labile protective group included in the side chain of the polymer may include any suitable functional group that is hydrophobic and separable from the polymer by an acid. In an implementation, the acid-labile protective group may include, e.g., $C_5$-$C_{20}$ alicyclic hydrocarbon groups such as a saturated or unsaturated adamantyl group, a saturated or unsaturated tricylcodecanyl group, a saturated or unsaturated norvinyl group, a saturated or unsaturated isovinyl group, a saturated or unsaturated cyclopentyl group, a saturated or unsaturated cyclohexyl group, etc. The alicyclic hydrocarbon group serving as an acid-labile protective group may increase the solubility difference between the exposed portion and the non-exposed portion of the photoresist composition to thereby improve the resolution of the photoresist film. In another implementation, the polymer may include, e.g., a tert-butyl group, a tetrahydropyranyl group, a tetrahydrofuranyl group, an ethoxyethyl group, etc. as the acid-labile protective group. These may be used alone or in a combination thereof.

In an implementation, the polymer may include, e.g., a first repeating unit having an acid-labile protective group at a side chain, a second repeating unit having a lactone ester group at a side chain, and a third repeating unit having an aliphatic hydrocarbon group substituted with a hydroxyl group.

The first repeating unit having the acid-labile protective group may increase the solubility difference between the exposed portion and the non-exposed portion of the photoresist film by acid catalysis and may also increase etching resistance of the photoresist film. The second repeating unit having the lactone ester group may provide hydrophilicity to the polymer. Thus, a portion of the polymer to be removed may be dissolved uniformly in a developer. Additionally, the second repeating unit may increase adhesion of the photoresist film to a substrate or a layer beneath the photoresist film. The third repeating unit having the aliphatic hydrocarbon group substituted with the hydroxyl group may increase the hydrophilicity of the polymer. Thus, the developer may easily penetrate into the photoresist film. Additionally, the third repeating unit may improve etching resistance and the adhesion of the photoresist film.

In an implementation, the polymer may be represented by Chemical Formula 6:

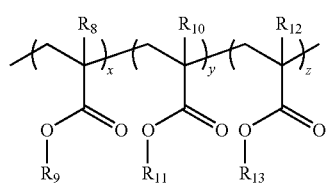

(6)

In Chemical Formula 6, $R_8$, $R_{10}$, and $R_{12}$ may each independently be hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group. $R_9$ may be an acid-labile protective group. $R_{11}$ may be a lactonester group. $R_{13}$ may be an aliphatic hydrocarbon group substituted with a hydroxyl group. x, y and z may satisfy the relations: $0<x<1$, $0<y<1$, $0<z<1$, and $0<x+y+z\leq 1$.

$R_9$ in Chemical Formula 6 may include, e.g., functional groups represented by Chemical Formula 7, but are not limited thereto.

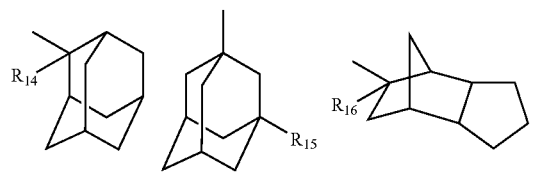

(7)

In Chemical Formula 6, $R_{14}$, $R_{15}$, and $R_{16}$ may each independently be hydrogen or a $C_1$-$C_{10}$ alkyl.

$R_{11}$ in Chemical Formula 6 may include, e.g., functional groups represented by Chemical Formula 8, but are not limited thereto.

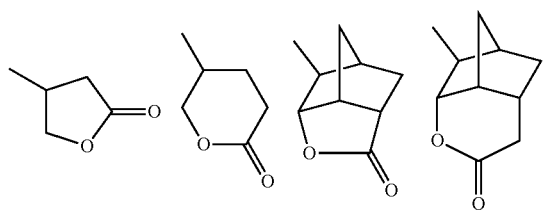

(8)

$R_{13}$ in Chemical Formula 6 may include, e.g., functional groups represented by Chemical Formula 9, but are not limited thereto.

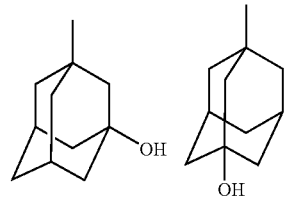

(9)

The polymer included in the photoresist composition may further include other kinds of repeating units. In an implementation, the other repeating units may be a monomer or a polymer and may include, e.g., an acrylate-based, a methacrylate-based, an acrylic acid, a methacrylic acid, a vinyl ester-based, a vinyl ether-based, a vinyl alcohol-based, a vinyl halide-based, an olefin-based, a cycloolefin-based, a styrene-based, a norbornene-based, a polyester-based, a polyamide-based, a polycarbonate-based, an anhydride maleate-based, an unsaturated anhydride-based repeating units, monomer or polymer. These may be used alone or in combinations thereof.

In an implementation, the polymer may include the repeating unit having the acid-labile protective group at the side chain in an amount of about 30 mol % to about 60 mol %, based on a total number of moles of the repeating units of the polymer. In another implementation, the repeating unit having the acid-labile protective group at the side chain may included in an amount equal to or more than about 35 mol %, equal to or more than about 40 mol %, or equal to or more than about 50 mol %, based on a total number of moles of the repeating units of the polymer. The amount of the acid-labile protective group may be larger than that of typical photoresist compositions, thereby increasing the solubility difference between the exposed portion and the non-exposed portion of the photoresist composition in a developer to improve the resolution of the photoresist film.

The polymer may have a weight-average molecular weight of about 1,000 to about 500,000. The molecular weight may be controlled in consideration of the desired viscosity or coatability of the photoresist composition, the resolution of the pattern, the profile of the pattern, the curing rate of the polymer, etc.

The polymer may be included in the composition in an amount of about 0.1% to about 40% by weight, based on a total weight of the photoresist composition. In an implementation, the polymer may be included in an amount of about 0.1% to about 20% by weight. However the amount of the polymer is not limited thereto; and an amount of the polymer may be used in consideration of the desired viscosity or coatability of the photoresist composition, or the desired quality of the pattern.

The photoresist composition may include the photoacid generator. The photoacid generator may include any suitable compound capable of generating acids by exposure to light. In an implementation, the photoacid generator may include, e.g., an onium salt, an aromatic diazonium salt, a sulfonium salt, a triarylsulfonium salt, a diarylsulfonium salt, a monoarylsulfonium salt, an iodinium salt, a diaryliodonium salt, a nitrobenzyl ester, a disulfone, a diazo-disulfone, a sulfonate, a trichloromethyl triazine, a N-hydroxysuccinimide triflate, etc.

In another implementation, the photoacid generator may include, e.g., phthalimido trifluoromethanesulfonate, dinitrobenzyltosylate, n-decyldisulfone, naphthylimido trifluoromethanesulfonate, diphenyliodonium hexafluorophosphate, diphenyliodonium hexaphlorofluoroarsenate, diphenyliodonium hexafluoroantimonate, diphenylparamethoxyphenyl triflate, diphenylparatoluenyl triflate, triphenylsulfonium triflate, or dibutylnaphtylsulfonium triflate. These may be used alone or in combinations thereof.

The photoacid generator may be included in an amount of about 0.01% to about 20% by weight, based on a total weight of the polymer. Maintaining the amount of the photoacid generator at about 0.01% by weight or greater may help ensure that the photosensitivity of the photoresist composition is not deteriorated. Maintaining the amount of the photoacid generator at about 20% by weight or less may help ensure that the photoacid generator does not absorb too much light, thereby ensuring a good pattern profile. In another implementation, the photoacid generator may be included in an amount of about 0.001% to about 10% by weight, based on a total weight of the photoresist composition. However, the amount of the photoacid generator is not limited thereto, and an amount of the photoacid generator may be determined in consideration of the desired quality of the pattern.

The photoresist composition may include the solvent capable of dissolving the polymer and the photoacid generator. The solvent may be an organic solvent. In an implementation, the solvent may include, e.g., an alkylene glycol alkylether, an alkylene glycol alkylester, an alkylene glycol alkylether ester, an ester, an ether, a lactone, a ketone, etc. In another implementation, the solvent may include, e.g., diethylene glycol diethyl ether, diethylene glycol dimethyl ether, diethylene glycol monoethyl ether, propylene glycol methyl ether, ethylene glycol monomethyl ether, ethylene glycol monoethyl ether, propylene glycol methyl ether, methyl 3-methoxypropionate, ethyl 3-ethoxypropionate, propylene glycol methyl ether acetate, cyclohexanone, 2-heptanone, 3-heptanone, 4-heptanone, γ-butyrolactone, ethyl lactate, methyl cellosolve acetate, methyl ethyl ketone, etc. These may be used alone or in combinations thereof.

The solvent may be included in an amount of about 10% to about 1,000% by weight, based on a total weight of the polymer. In an implementation, the solvent may be may be included in an amount of about 45% to about 99.898%, or about 65% to about 99.898% by weight, based on a total weight of the photoresist composition. However, the amount of the solvent is not limited thereto, and may be controlled in consideration of the desired viscosity or coatability of the photoresist composition, the drying rate of the photoresist film, etc.

The photoresist composition according to the example embodiments may be prepared by dissolving the additive, the polymer, and the photoacid generator in the solvent. The photoresist composition may also include, e.g., a crosslinking activator, a thermal-acid generator, a surfactant, a silane coupling agent, a dye, a filler, a viscosity modifier, etc. A nonionic, cationic, anionic, or amphoteric surfactant may be used as a surfactant, but is not limited thereto. The crosslinking activator is a component for stimulating a crosslinking reaction of the crosslinking activator, and any suitable common crosslinking activator may be used. The filler may include, e.g., barium sulfate, talc, glass bubble, etc. The viscosity modifier may include, e.g., silica.

Hereinafter, example embodiments will be explained in detail with reference to the accompanying drawings.

Method of Forming a Pattern

Figure 2:
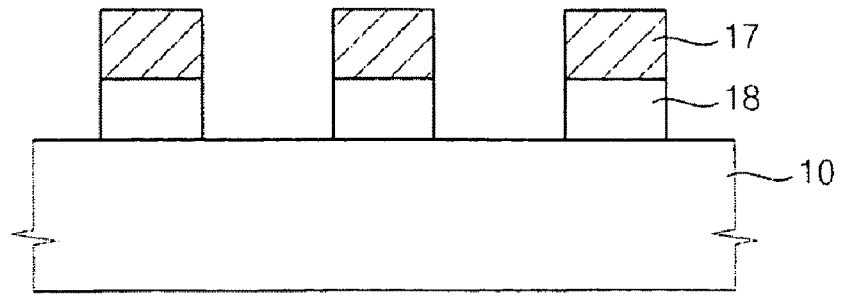

FIG. 1 and FIG. 2 illustrate cross sectional views of stages in a method of forming a pattern in accordance with an embodiment.

Referring to FIG. 1, an etch-target layer 12 may be formed on a substrate 10. A photoresist film 13 may be formed on the etch-target layer 12.

The substrate 10 may include any suitable object on which the photoresist film 13 and the etch-target layer 12 may be formed. In an implementation, the substrate 10 may include, e.g., a semiconductor substrate, a SOI substrate, a glass substrate, a printed circuit board, a polymer plate, a metal plate, etc., but is not limited thereto. Additionally, various structures, e.g., devices, wirings, patterns, films, holes, and/or trenches, may be further formed on the substrate 10 before the etch-target layer 12 is formed on the substrate 10.

The etch-target layer 12 may include any layer to which an image may be transferred from the photoresist film 13. In an implementation, the etch-target layer 12 may include, e.g., a mask layer, a hard mask layer, an insulating layer, a conductive layer, an oxide layer, a nitride layer, an oxynitride layer, a metallic layer, a metallic nitride layer, a semiconductor layer, a polymer layer, etc., but is not limited thereto. The etch-target layer 12 may be formed by a deposition process, e.g., a chemical vapor deposition (CVD) process, a physical vapor deposition (PVD) process, and an atomic layer deposition (ALD) process, etc., or by a coating process.

The photoresist film 13 may be formed on the etch-target layer 12 using the photoresist composition of an embodiment, which has been described above. In particular, the photoresist film 13 may be formed by coating the photoresist composition including the polymerized photoresist additive, the polymer having the acid-labile protective group at the side chain, the photoacid generator, and the solvent. The polymerized photoresist additive may include the hydrophilic repeating unit having the aliphatic hydrocarbon backbone and the side chain containing the oxygen heteroatom in the heterocyclic ring substituted with at least three hydroxyl groups, and the hydrophobic repeating unit having the aliphatic hydrocarbon backbone and the side chain containing the fluorinated aliphatic hydrocarbon group.

The photoresist film 13 may be formed by a coating process, e.g. a spin coating process, a spray coating process, a deep coating process, etc. After the photoresist film 13 is formed on the etch-target layer 12, the solvent may be removed by a pre-baking process.

Referring again to FIG. 1, an upper surface of the photoresist film 13 may be exposed to light, which has been filtered by a photomask 16. Thus, images of the photomask 16 may be transferred to the photoresist film 13. A first portion of the photoresist film 13 exposed to the light may be referred to as an exposed portion 14; and a second portion of the photoresist film 13 not exposed to the light may be referred to as a non-exposed portion 15. Sources of the light may include, e.g., an ArF laser, a KrF laser, an electron beam, an ion beam, an X-ray, an Hg—Xe light, a G-line beam, an I-line beam, ultraviolet rays, extreme ultraviolet rays, radiation rays, etc.

In the exposed portion 14, an acid may be generated from the photoacid generator by exposure to the light. The acid generated in the exposed portion 14 may be activated during the post-exposure baking process, thereby causing a chain reaction. The acid-labile protective group may be separated from the polymer in the exposed portion of the photoresist composition by acid catalysis; and the polymer without the acid-labile protective group may be easily dissolved in a developer.

Referring to FIG. 2, the exposed portion 14 of the photoresist film 13 may be removed by a developing process; and a photoresist pattern 17 including the non-exposed portion 15 may remain on the etch-target layer 12. After the photoresist film 13 is developed, residues of the photoresist composition may be removed by a rinsing process using pure water. The developer may include any suitable material capable of dissolving the polymer. In an implementation, the developer may include, e.g., an alkali aqueous solution such as tetramethylammonium hydroxide (TMAH) 2.38% aqueous solution.

The photoresist composition of an embodiment may include the polymer having the acid-labile protective group in a relatively high ratio. As the ratio of the acid-labile protective groups increases, the solubility rate difference between the exposure portion 14 and non-exposure portion 15 may increase, thus improving contrast and resolution of the photoresist pattern 17.

When the hydrophobicity of the photoresist composition increases because of the increase of the amount of the acid-labile protective group of the polymer, the wettability of the photoresist composition in the developer or water may decrease. Therefore, residues of the photoresist composition may remain due to the imperfect removal of the exposed portion 14 of the photoresist film 13 in the developing and subsequent rinsing processes. The residues of the photoresist composition may cause defects of patterns. The photoresist composition of an embodiment may include the polymerized additive having a high ratio hydrophilic repeating unit, thus having improved wettability in the aqueous solvent, e.g., water or an alkali developer. Accordingly, generation of the residues of the photoresist composition may be decreased.

Figure 3:
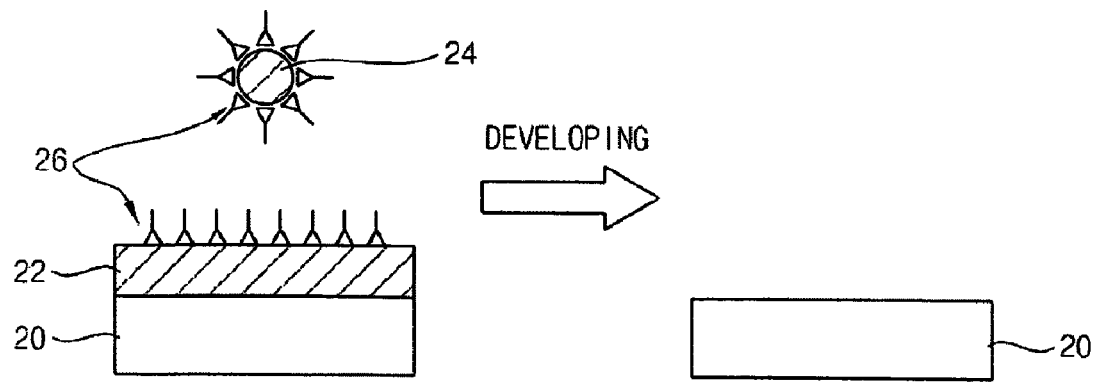
FIG. 3 illustrates a diagram of a process of removal of a photoresist film in a developing process according to an embodiment.

FIG. 3 illustrates a diagram of a process of removal of a photoresist film in a developing process in accordance with an embodiment.

Referring to FIG. 3, the additive 26 included in the photoresist composition may be a surfactant having a hydrophilic portion and a hydrophobic portion. Thus, the additive 26 may spread on a top surface of the photoresist film 22. In particular, the hydrophobic portion of the polymerized additive 26 may be arranged toward the photoresist film 22; and the hydrophilic portion of the polymerized additive 26 may be arranged toward the developer or aqueous solvent. Thus, the polymerized additive 26 may spread on the top surface of the photoresist film 22. The polymerized additive 26 spread on the top surface of the photoresist film 22 may increase the solubility rate of the photoresist film 22 in the developer, so that the photoresist film 22 may be easily dissolved in the developer. Additionally, surfaces of photoresist particles 24 separated from the photoresist film 22 by dissolution in the developer may be surrounded by the polymerized additive 26. Thus, the photoresist particles 24 may be prevented from being re-deposited on the photoresist film 22 or the substrate 20 due to the additive 26 surrounding the surfaces thereof.

Due to the presence of the additive 26, the exposed portion 14 of the photoresist film 13 may be removed without generation of residues in the developing process. After the developing process, the separated photoresist particles 24 and a remaining portion of the developer may be removed from the substrate 20 by a rinsing process using pure water.

Referring to FIG. 2 again, the etch-target layer 12 may be partially removed using the photoresist pattern 17 as an etching mask to form an etch-target layer pattern 18 on the substrate 10. The etch-target layer pattern 18 may be formed by, e.g., a dry etching process or a wet etching process, in consideration of the etching rate and etching selectivity of the photoresist pattern 17 and the etch-target layer 12.

In FIGS. 1 and 2, the etch-target layer 12 may be patterned using the photoresist pattern 17 as an etching mask. Alternatively, the substrate 10 itself may be patterned using the photoresist pattern 17 as an etching mask, without the etch-target layer 12 on the substrate 10. In this case, images of the photoresist pattern 17 may be transferred to a top surface of the substrate 10. Thus, patterns e.g., a trench or a hole, may be formed at an upper portion of the substrate 10.

Methods of Manufacturing Semiconductor Devices

FIGS. 4 to 7 illustrate cross-sectional views of stages in a method of manufacturing a dynamic random access memory (DRAM) device in accordance with an embodiment.

Figure 4:
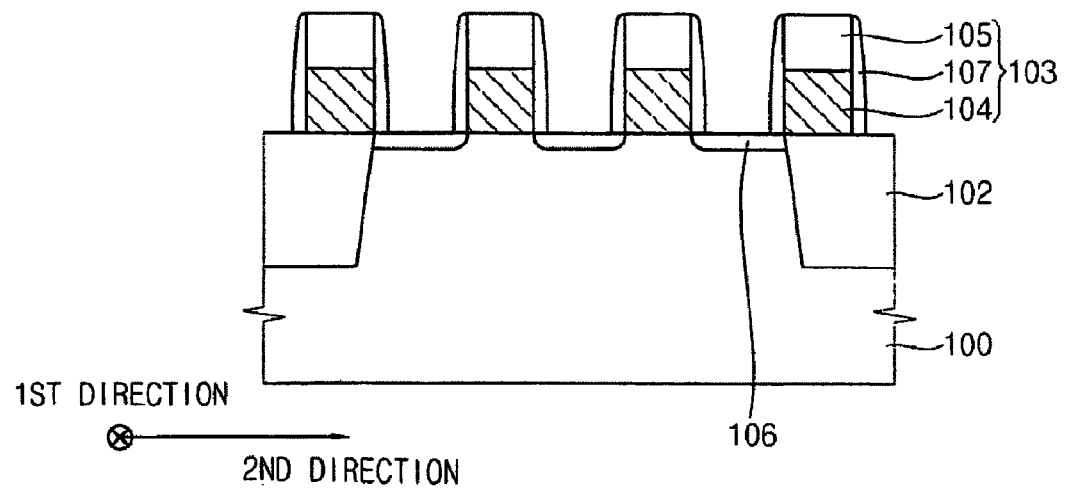
FIGS. 4 to 7 illustrate cross-sectional views of stages in a method of manufacturing a dynamic random access memory (DRAM) device according to an embodiment.

Referring to FIG. 4, an isolation layer 102 may be formed on a substrate 100 by a shallow trench isolation (STI) process. Particularly, a pad oxide layer (not shown), a mask layer (not shown), and a photoresist pattern (not shown) may be sequentially formed on the substrate 100. The mask layer and the pad oxide layer may be patterned using the photoresist pattern as an etching mask to form a mask (not shown) and a pad oxide layer pattern (not shown) on the substrate 100. The photoresist pattern may be removed by, e.g., an ashing process and/or a stripping process, and the substrate 100 may be partially removed using the mask as an etching mask to form a trench (not shown) at an upper portion of the substrate 100. An insulating material may be filled into the trench to form the isolation layer 102.

The photoresist pattern may be formed on the mask layer using the photoresist composition and method of forming the pattern in accordance with an embodiment. In particular, a photoresist film (not shown) including the photoresist composition may be formed on the mask layer. The photoresist film may be partially removed by an exposure process and a developing process, thereby forming the photoresist pattern on the mask layer. The mask layer and the pad oxide layer may be patterned using the photoresist pattern as an etching mask to form the mask and the pad oxide layer pattern, respectively. After removing the photoresist pattern, the substrate 100 may be partially removed using the mask as an etching mask to form the trench.

A gate structure 103 may be formed on the substrate 100 having the isolation layer 102 thereon. In an implementation, a plurality of gate structures 103 may be formed on the substrate 100. Each gate structure 103 may extend in a first direction and may include a gate insulating layer (not shown), a gate electrode 104, a gate mask 105, and a gate spacer 107. The photoresist composition and the method of forming the pattern in accordance with an embodiment may be used in a patterning process for forming the gate structure 103. An impurity region 106 may be formed at an upper portion of the substrate 100 adjacent to the gate structure 103 by an ion implantation process. In an implementation, a plurality of impurity regions 106 may be formed and may serve as source/drain regions. The gate structure 103 and the source/drain regions 106 may define a transistor.

Figure 5:
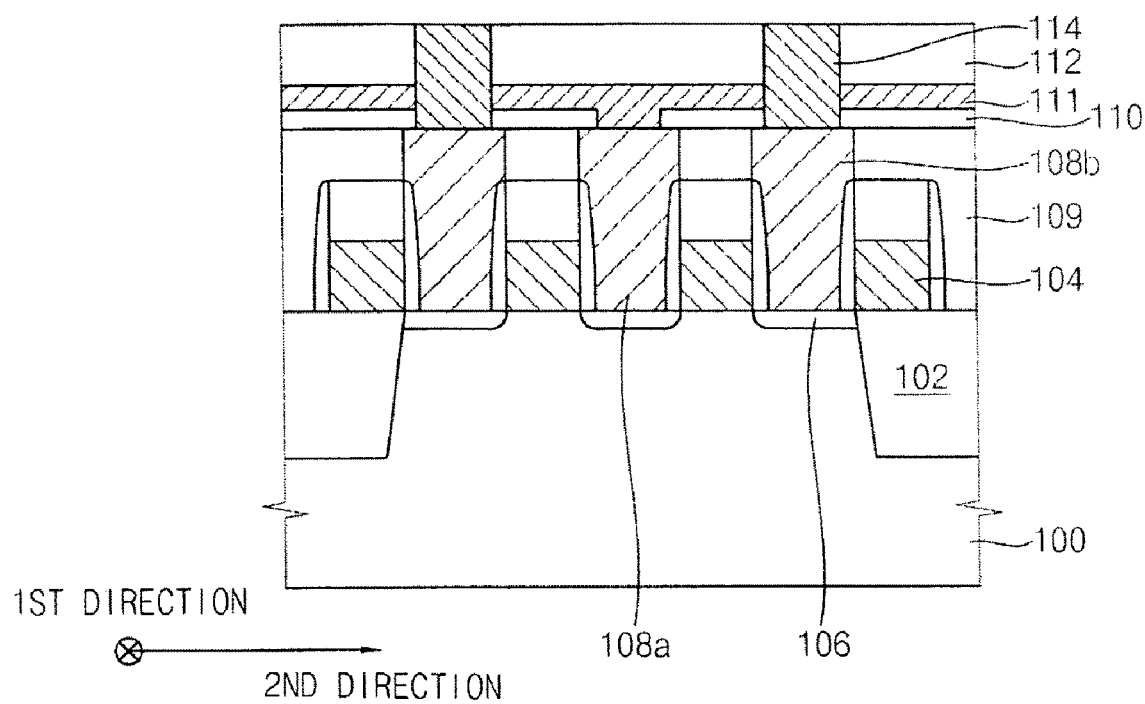

Referring to FIG. 5, a first insulating interlayer 109 may be formed on the substrate 100 to cover the transistor. The first insulating interlayer 109 may be partially etched to form first openings (not shown) through the first insulating interlayer 109, thereby exposing the impurity regions 106. A first conductive layer may be formed on the impurity regions 106 and the first insulating interlayer 109 to fill the openings. An upper portion of the first conductive layer may be planarized until a top surface of the first insulating interlayer 109 is exposed, thereby forming a first plug 108a and second plugs 108b. The first and second plugs 108a and 108b may be electrically connected to the impurity regions 106. The photoresist composition and the method of forming the pattern in accordance with an embodiment may be used in the etching process of the first insulating interlayer 109 for forming the first openings.

A second insulating interlayer 110 may be formed on the first insulating interlayer 109 and the plugs 108a and 108b. The second insulating interlayer 110 may be partially removed to form a hole (not shown) therethrough exposing the first plug 108a. A second conductive layer may be formed on the first plug 108a and the second insulating interlayer 110 to fill the hole. The second conductive layer may be patterned to form a bitline 111 on the second insulating interlayer 110, which may be electrically connected to the first plug 108a. In an implementation, the bitline 110 may extend in a second direction perpendicular to the first direction.

A third insulating interlayer 112 may be formed on the second insulating interlayer 110 to cover the bitline 111. The third insulating interlayer 112 and the second insulating interlayer 110 may be partially etched to form second openings (not shown) therethrough exposing the second plugs 108b. The photoresist composition and the method of forming the pattern in accordance with an embodiment may be used in the etching process of the second and third insulating interlayers 110 and 112 for forming the second openings. A third conductive layer may be formed on the second plugs 108b and the third insulating interlayer 112 to fill the second openings. An upper portion of the third conductive layer may be planarized until a top surface of the third insulating interlayer 112 is exposed, thereby forming third plugs 114.

Figure 6:
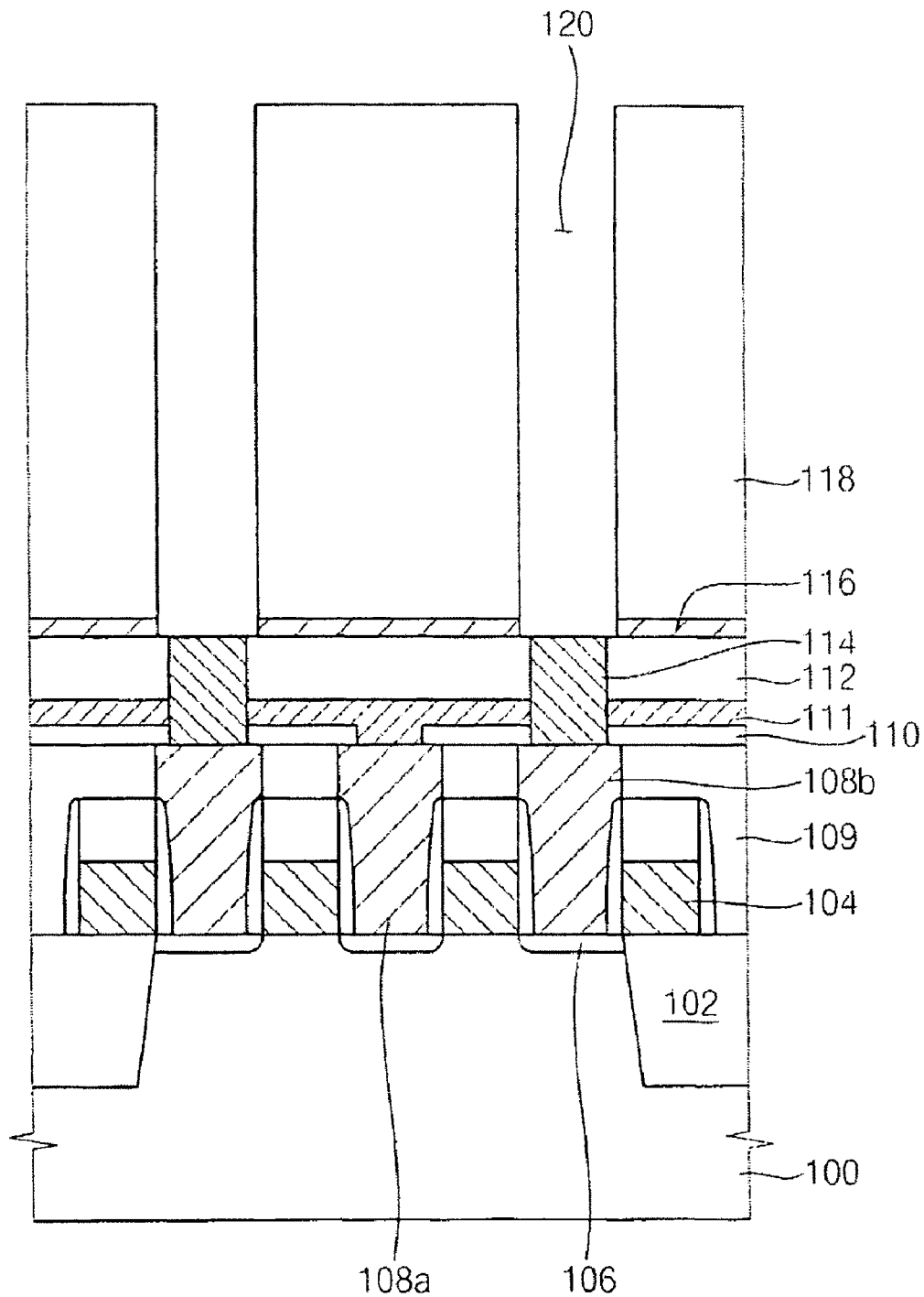

Referring to FIG. 6, an etch stop layer 116 may be formed on the third insulating interlayer 112 and the third plugs 114. A mold layer 118 may be formed on the etch stop layer 116. The etch stop layer 116 may be formed using a material having an etching selectivity with respect to the mold layer 118, e.g., silicon nitride. The mold layer 118 may be formed using an oxide, e.g., tetraethyl orthosilicate (TEOS), phospho silicate glass (PSG), undoped silicate glass (USG), boro-phospho silicate glass (BPSG), silicon on glass (SOG) or high density plasma chemical vapor deposition (HDP-CVD) oxide, etc.

Third openings 120 exposing top surfaces of the third plugs 114 may be formed by partially etching the mold layer 118 and the etch stop layer 116. The photoresist composition and the method of forming the pattern in accordance with an embodiment may be used in the etching process of the mold layer 118.

Figure 7:
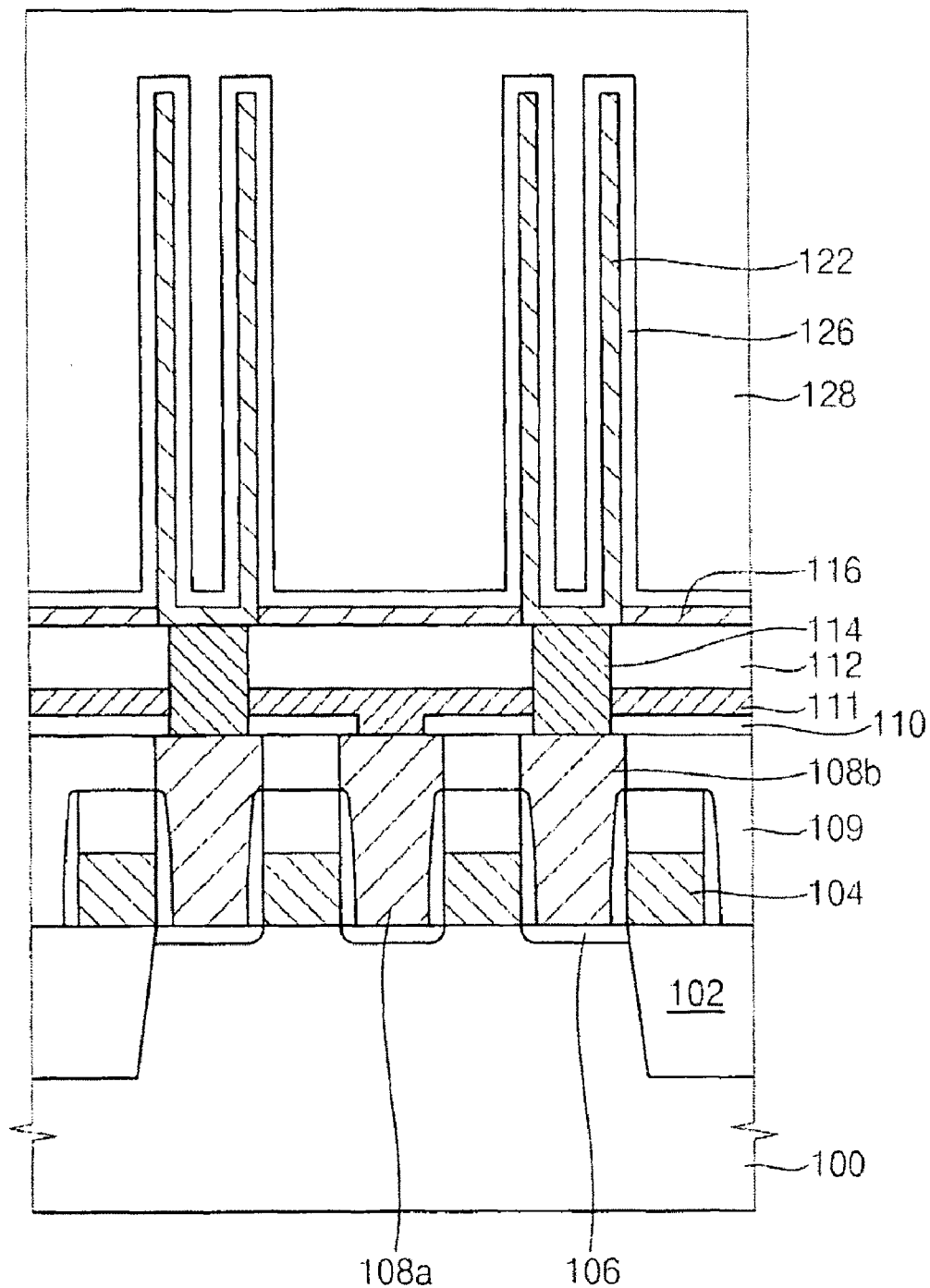

Referring to FIG. 7, a fourth conductive layer may be formed on bottoms and sidewalls of the third openings 120 and a top surface of the mold layer 118. The third conductive layer may be formed using a conductive material, e.g., a metal or a metal nitride. A buffer layer (not shown) may be formed on the third conductive layer to fill the remaining portion of the third openings 120. Upper portions of the buffer layer and the third conductive layer may be planarized until a top surface of the mold layer 118 is exposed, thereby forming a lower electrode 122 on the bottoms and the sidewalls of the third openings 120. The mold layer 118 and the buffer layer may be removed to expose sidewalls of the lower electrode 122.

A dielectric layer 126 and an upper electrode 128 may be sequentially formed on the lower electrode 122 and the etch stop layer 116. Thus, capacitors each including the lower electrode 122, the dielectric layer 126, and the upper electrode 128 may be formed on the third insulating interlayer 112 to be electrically connected to the third plugs 114. The dielectric layer 126 may be formed using, e.g., silicon oxide or an oxide having a high dielectric constant. The upper electrode 128 may be formed using a conductive material, e.g., a metal or a metal nitride. Wirings (not shown) may be further formed on the upper electrode 128 to form the DRAM device.

FIGS. 8 to 12 illustrate cross-sectional views of stages in a method of manufacturing a flash memory device in accordance with an embodiment.

Figure 8:
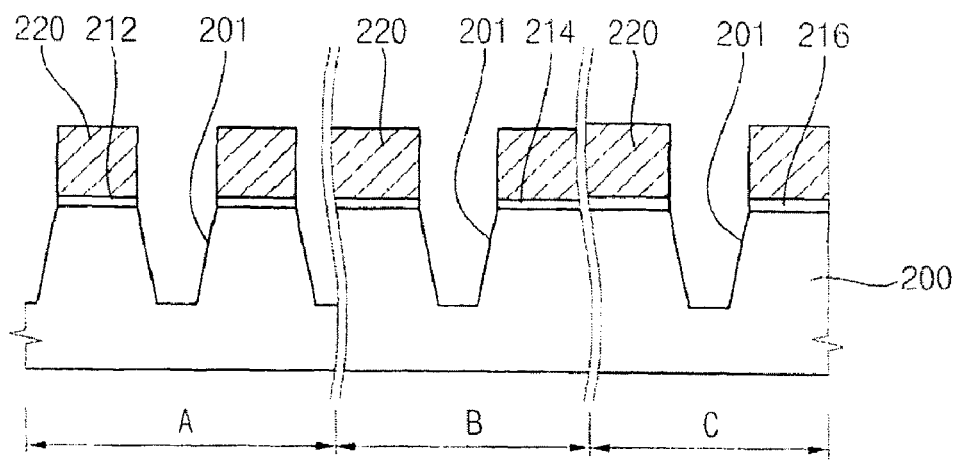
FIGS. 8 to 12 illustrate cross-sectional views of stages in a method of manufacturing a flash memory device according to an embodiment.

Referring to FIG. 8, first, second, and third dielectric layer patterns 212, 214, and 216 and a first conductive layer pattern 220 may be sequentially formed on a substrate 200, which may be divided into a cell region A and core/peripheral regions B and C. In the core/peripheral regions B and C, the region B may indicate a low-voltage transistor region and the region C may indicate a high-voltage transistor region. The first, second and third dielectric layer patterns 212, 214, and 216 may be formed in the cell region A, in the low-voltage transistor region B, and in the high-voltage transistor region C, respectively.

The dielectric layer patterns 212, 214, and 216 and the first conductive layer pattern 220 may be formed by a deposition process and an etching process. Particularly, a dielectric layer and a first conductive layer may be sequentially formed on the substrate 100. The dielectric layer may be formed by a thermal oxidation process. In an implementation, the dielectric layer may be formed to have a relatively thin structure in the cell region A and the low-voltage transistor region B, and a relatively thick structure in the high-voltage transistor region C. The first conductive layer may be formed using a conductive material, e.g., polysilicon, a metal, etc.

The photoresist composition and the method of forming the pattern in accordance with an embodiment may be used in patterning the dielectric layer and the first conductive layer. In particular, a photoresist film (not shown) may be formed on the first conductive layer using the photoresist composition. The photoresist film may be exposed to light; and an exposed portion of the photoresist film may be cured. A non-exposed portion of the photoresist film may be removed by a developer to form the photoresist pattern (not shown). The first conductive layer and the dielectric layer may be patterned using the photoresist pattern as an etching masks, thereby forming the first conductive layer pattern 220 and the dielectric layer patterns 212, 214, and 216, respectively. In an implementation, each of the first conductive layer pattern 220 and the dielectric layer patterns 212, 214, and 216 may extend in a first direction. The photoresist pattern may be removed by, e.g., an ashing and/or a stripping process.

The substrate 200 may be partially removed using the first conductive layer pattern 220 as an etching mask to form a plurality of trenches 201 on the substrate 200.

Figure 9:
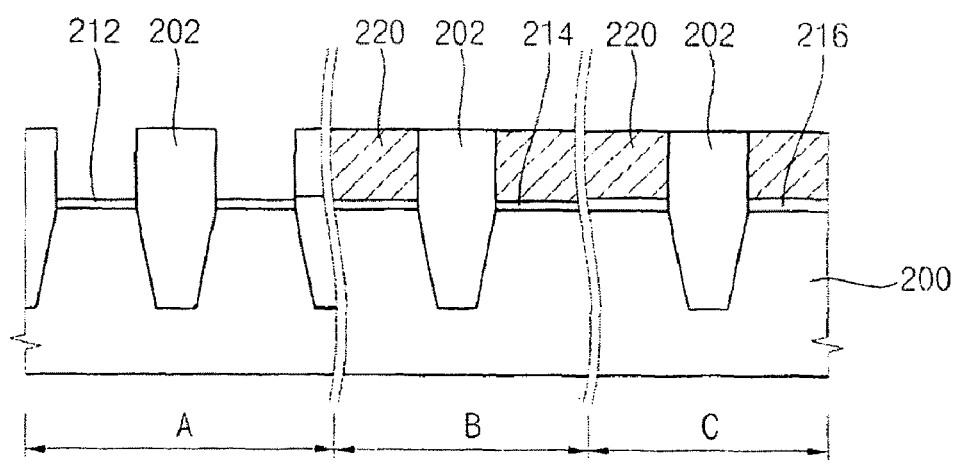

Referring to FIG. 9, a plurality of isolation layers 202 may be formed in the trenches 201. In particular, an insulating layer may be formed on the trenches 201 and the first conductive layer pattern 220 to fill the trenches 201. Then, an upper portion of the insulating layer may be planarized until a top surface of the conductive layer pattern 220 is exposed so that the isolation layers 202 may be formed in the trenches 201. In an implementation, each isolation layer 202 may extend in the first direction.

A first portion of the first conductive layer pattern 220 in the cell region A may be removed so that the first dielectric layer pattern 212 may be exposed. When the first portion of the first conductive layer pattern 220 is removed, second and third portions of the first conductive layer pattern 220 in the core/peripheral regions B and C may be covered by a photosensitive mask. The photosensitive mask may be formed using the photoresist composition in accordance with an embodiment.

Figure 10:
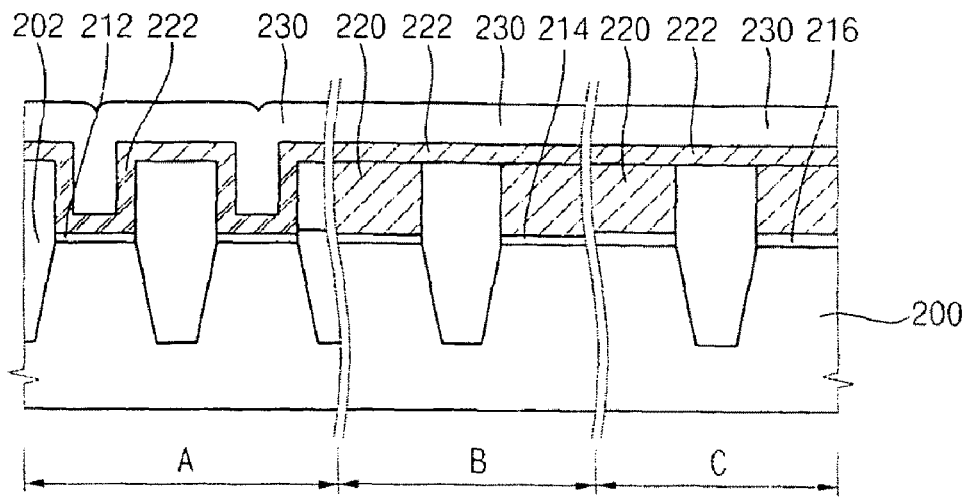

Referring to FIG. 10, a second conductive layer 222 may be formed on the first conductive layer pattern 220, the isolation layers 202, and the first dielectric layer pattern 212. In an implementation, the second conductive layer 222 may be conformally formed thereon, and thus may not completely fill spaces between the isolation layers 202 on the first dielectric layer pattern 212. The second conductive layer 222 may be formed using a material substantially the same as or different from that of the first conductive layer 220.

A sacrificial layer 230 may be formed on the second conductive layer 222 to fill the remaining portions of the spaces between the isolation layers 202 on the first dielectric layer pattern 212.

Figure 11:
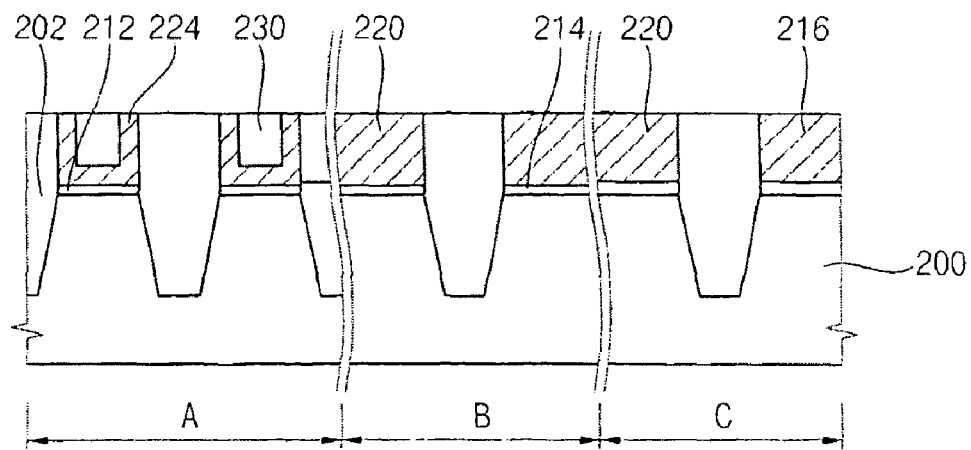

Referring to FIG. 11, upper portions of the sacrificial layer 230 and the second conductive layer 222 may be planarized until a top surface of the first conductive layer pattern 220 is exposed. Therefore, a second conductive layer pattern 224 having a U-shape may be formed on the first dielectric layer pattern 212 in the cell region A.

Figure 12:
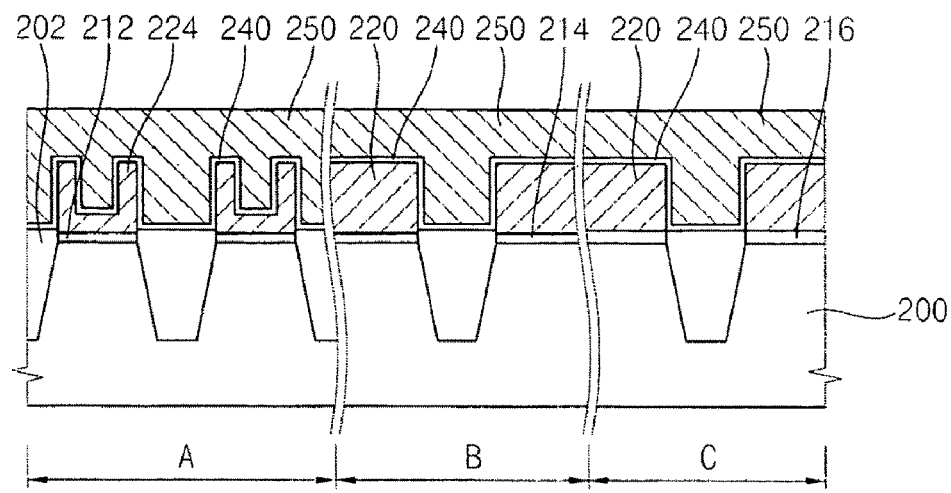

Referring to FIG. 12, upper portions of the isolation layers 202 may be removed to expose sidewalls of the second conductive layer pattern 224 in the cell region A and the sidewalls of the first conductive layer pattern 220 in the core/peripheral regions B and C. The sacrificial layer 230 may be removed to expose a top surface of the second conductive layer pattern 224.

A dielectric layer and a third conductive layer may be sequentially formed on the first and second conductive layer patterns 220 and 224 and the isolation layers 202. The third conductive layer and the dielectric layer may be patterned to form a control gate 250 and a dielectric layer pattern 240, respectively. In an implementation, each of the control gate 250 and the dielectric layer pattern 240 may extend in a second direction perpendicular to the first direction. Additionally, the first and second conductive layer patterns 220 and 224 may be patterned to extend in the second direction. Thus, the flash memory device in accordance with an embodiment may be manufactured. The photoresist compositions and the methods of forming the patterns in accordance with example embodiments may be used in the patterning process.

The photoresist composition and the method of forming the pattern in accordance with an embodiment are not limited to the DRAM device or the flash memory device. The composition and method may be applicable to other memory devices, e.g., a ferroelectric random access memory (FeRAM) device, a magnetic random access memory (MRAM) device, a phase-change random access memory (PRAM) device, etc., or other electronic devices such as logic circuit devices, integrated circuit (IC) devices, thin film transistors (TFTs), display devices, printed circuit boards (PCBs), microelectromechanical systems (MEMS), micro machines, image sensor devices, etc.

Hereinafter, Examples and Comparative Examples will be described more fully. The embodiments may, however, be embodied in many different forms and should not be construed as limited to Examples set forth herein. Rather, these Examples are provided so that this description will be thorough and complete, and will fully convey the scope of the embodiments to those skilled in the art.

PREPARATION OF PHOTORESIST
COMPOSITIONS

Example 1

Under conditions in which far-ultraviolet radiation was blocked, about 1,000 ppm (about 0.1% by weight) of an additive represented by Chemical Formula 10 (product name S3, ShinEtsu Chemical Co.), about 12% by weight of a polymer compound including a methacrylate-based resin and a cycloolefin-based resin in a weight ratio of about 40:60, and about 0.8% by weight of dimethylphenylsulfonium triflate were dissolved in about 87.1% by weight of an organic solvent. The solution was then filtered with a 0.2 μm filter to prepare a photoresist composition. The viscosity of the prepared photoresist composition was about 2.2 cP.

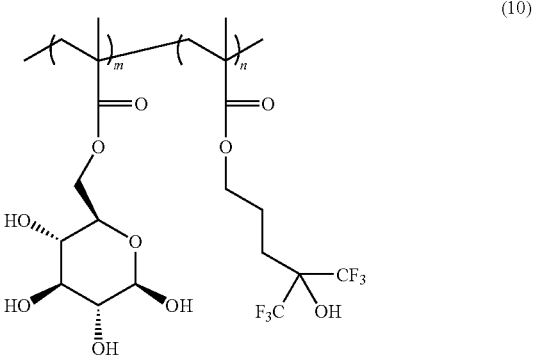

(10)

The additive had a weight-average molecular weight of about 2,000 (±1,000) and a ratio of m and n in Chemical Formula 10 was about 60:40. In the additive, a hydrophilic portion had a side chain substituted with D-glucose and a hydrophobic portion had a side chain substituted with bis(trifluoromethyl)hydroxyalkyl. The methacrylate-based resin was a monomer having an acid-labile protective group and was prepared using about 20% by mole of 2-methyl-2-adamantyl methacrylate and about 30% by mole of 1-methylcyclopentyl methacrylate. The cycloolefin-based resin was a cycloolefin-maleate copolymer, and prepared using about 35% by mole of 1-methylcyclopentyl-5-norbornene-2-carboxylate. An amount of repeating units having the acid-labile protective group based on a total amount of repeating units of the polymer was about 41%. The solvent was prepared using propyleneglycol monomethyl ether acetate, cyclohexanone, and γ-butyrolactone in a volume ratio of about 70:25:5

Comparative Example 1

A photoresist composition was prepared by a method substantially the same as that of Example 1, except that a surfactant having low hydrophilicity represented by Chemical Formula 11 (product name S1, ShinEtsu Chemical. Co.) was used instead of the additive represented by Chemical Formula 10. The viscosity of the prepared photoresist composition was about 2.2 cP. The surfactant represented by Chemical Formula 11 had a weight-average molecular weight of about 2,000(±1,000) and a ratio of m and n was about 50:50.

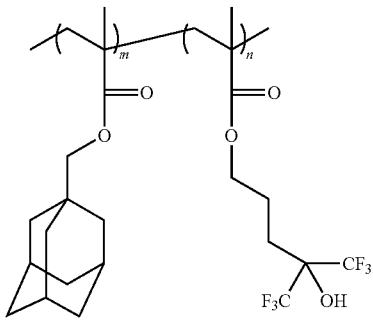

(11)

Examples 2 and 3

A photoresist composition was prepared by adding about 1000 ppm of the additive represented by Chemical Formula 10 to a commercial photoresist composition for ArF. SXG173 (product number) provided by ShinEtsu Chemical. Co. was used in Example 2, and SXM6060 (product number) provided by ShinEtsu Chemical. Co. was used in Example 3.

Comparative Examples 2 and 3

SXG173 (product number) and SXM6060 (product number) provided by ShinEtsu Chemical. Co, each of which is a photoresist composition for ArF with no additive, were prepared.

Evaluation of Defects of Photoresist Patterns

A photoresist pattern was formed by using the photoresist compositions manufactured in Example 1 and Comparative Example 1.

After spin coating the photoresist composition of Example 1 on a silicon wafer treated with hexamethyldisilazane (HDMS) as an adhesion promoter, the coated film was soft-baked at a temperature of about 110° C. for about 60 seconds so that a photoresist film was formed to have a thickness of about 0.25 μm. The photoresist film was exposed to light by an ArF exposure apparatus and was baked at a temperature of about 110° C. for about 60 seconds. The photoresist film was developed using a 2.38% TMAH solution to form a first photoresist pattern. A second photoresist pattern was formed using the photoresist composition of Comparative Example 1 by processes substantially the same as the above. Evaluation results of the performance of the first and second photoresist patterns in a photo process and the ratio of defects thereof are shown in Table 1. The ratio of defects was evaluated for the first and second photoresist patterns on the silicon wafer by an ADI defect detector provided by KLA-Tencor. Co.

TABLE 1

|  | Comparative Example 1 | Example 1 |
| --- | --- | --- |
| Optimum Exposure Amount (Eop) | 37 mJ | 36 mJ |
| Dose Sensitivity (DS) | 2 nm/mJ | 2.25 nm/mJ |
| 5% Energy Latitude (EL) | 9% | 8% |
| Depth of Focus (DOF) | 0.15 μm | 0.15μ |
| Ratio of Defects | 64% | 0% |

As shown in Table 1, the photoresist compositions of Comparative Example 1 and Example 1 exhibited similar levels of optimum exposure amount, 5% EL, dose sensitivity, and depth of focus, which means the photoresist compositions have similar performance in a photolithography process. However, the photoresist compositions of Example 1 and Comparative Example 1 exhibited ratios of defects very different from each other. In particular, the first photoresist pattern formed using the photoresist composition of Example 1 had no defects. On the other hand, the second photoresist pattern formed using the photoresist composition of Comparative Example 1 had a ratio of defects of about 64%.

Figure 13:
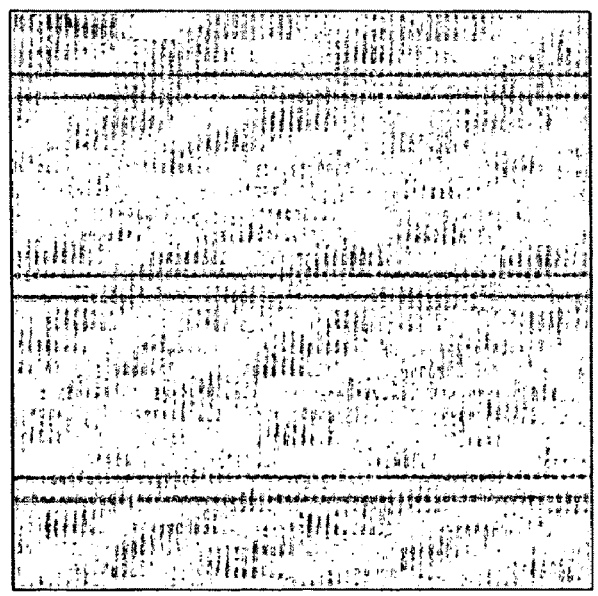
FIGS. 13 and 14 illustrate electron microscope images showing the first and second photoresist patterns formed using the photoresist compositions of Example 1 and Comparative Example 1, respectively.
Figure 14:
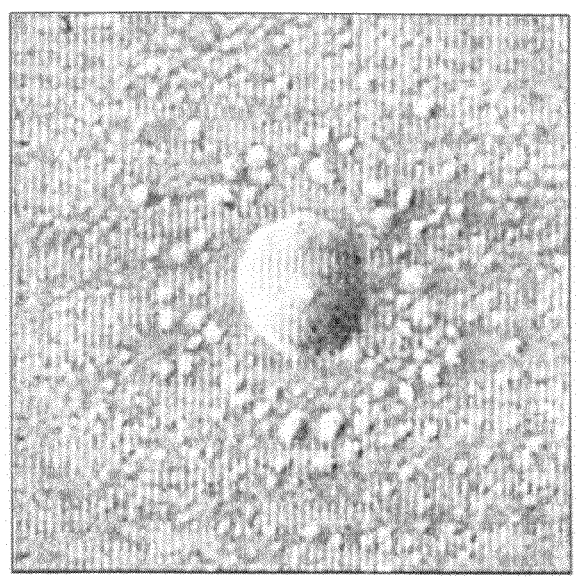

FIGS. 13 and 14 illustrate electron microscope images showing the first and second photoresist patterns formed using the photoresist compositions of Example 1 and Comparative Example 1, respectively.

Referring to FIG. 13, the first photoresist pattern formed using the photoresist composition of Example 1 had no residue or defects. However, referring to FIG. 14, the second photoresist pattern formed using the photoresist composition of Comparative Example 1 had a lot of residues and defects.

Therefore, generation of residues or defects of a photoresist pattern in a developing process may be decreased significantly by preparing a photoresist composition including a polymerized material having highly hydrophilic side chain groups containing a plurality of hydroxyl groups.

Evaluation of the Hydrophilicity, Solubility Rate and Number of Defects of Photoresist Films Changes in properties of commercial photoresist compositions for ArF by adding the polymerized additive having the highly hydrophilic side chain to the photoresist composition was evaluated.

In particular, after forming photoresist films using the photoresist compositions of Examples 2 and 3 and Comparative Examples 2 and 3, respectively, contact angles of the photoresist films with respect to water or an aqueous alkali developer were measured, thereby evaluating the hydrophilicity of the photoresist films.

After dropping about 5 μl of deionized water on the photoresist films formed by a coating process and a soft-baking (SB) process, contact angles of the photoresist films to the deionized water at three points thereof were measured three times, respectively. The contact angles were evaluated by calculating the average value of the nine resultant contact angles. Additionally, contact angles of the photoresist films to the developer were evaluated by processes substantially the same as or similar to those of the contact angles to the deionized water using a 2.38% TMAH aqueous solution. In particular, an exposure process was skipped, and after performing a developing process and a post-exposure baking process (PEB) on the photoresist films, contact angles of the aqueous solvent were measured. After dropping about 5 μl deionized water and about 5 μl of 2.38% TMAH aqueous solution on the photoresist films, contact angles of the photoresist films to the aqueous solution at three points were measured three times, respectively. The contact angles were evaluated by calculating the average value of the nine resultant contact angles. The evaluation results are shown in Table 2.

TABLE 2

| Surface | Solution | Comparative Example 2 | Example 2 | Comparative Example 3 | Example 3 |
|---|---|---|---|---|---|
| After coating (SB) | DIW | 70.8 | 71.5 | 72.7 | 72.4 |
| | TMAH | 69.8 | 60.4 | 70.8 | 64.1 |
| After developing (SB/PEB/Dev) | DIW | 69.9 | 64.0 | 68.1 | 66.7 |
| | TMAH | 64.9 | 54.8 | 62.5 | 52.6 |

Referring to Table 2, the contact angles of the photoresist films to the deionized water (or the alkali developer) were greatly decreased by adding the polymerized additive having the highly hydrophilic side chain thereto. Dropping the deionized water on the photoresist films after the developing process may be referred to as a rinsing process. The contact angles to deionized water were also greatly decreased. The contact angles may be decreased because the hydrophilicity of surfaces of the photoresist films may increase, which means the wettability of the photoresist films to a surface of water or TMAH is improved and the photoresist films may be dissolved more easily therein.

After forming first, second, third, and fourth photoresist films using the photoresist compositions of Examples 2 and 3 and Comparative Examples 2 and 3, respectively, solubility rates of the photoresist films in an aqueous alkali developer were measured. In particular, an exposure process was skipped and after performing a coating process, a soft-baking (SB) process, and a post-exposure baking (PEB) process on the photoresist films, the solubility rates of the photoresist films in a 2.38% TMAH solution were measured.

Figure 15:
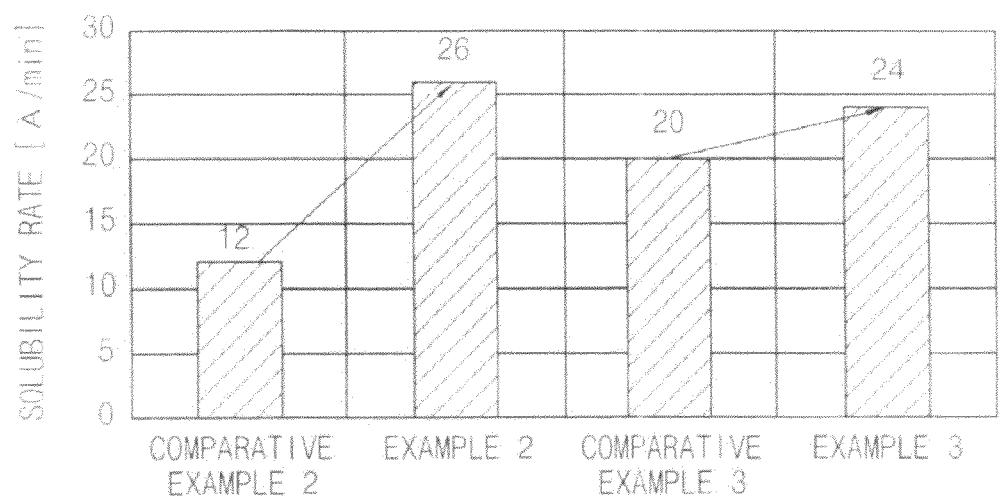
FIG. 15 illustrates a graph showing solubility rates of first, second, third, and fourth photoresist films formed using the photoresist compositions of Example 2 and 3 and Comparative Example 2 and 3, respectively, in the developer.

FIG. 15 illustrates a graph showing the solubility rates of the first, second, third, and fourth photoresist films formed using the photoresist compositions of Examples 2 and 3 and Comparative Examples 2 and 3, respectively, in the developer.

Referring to FIG. 15, the first photoresist film had a solubility rate in the developer about 117% higher than that of the third photoresist pattern film. Additionally, the second photoresist film had a solubility rate in the developer about 20% higher than that of the fourth photoresist film. Therefore, the solubility rate of the photoresist films formed using the photoresist compositions including the additive may be improved regardless of the kinds of the photoresist composition.

After forming first, second, third, and fourth photoresist patterns on a wafer by a coating process, an exposure process and a developing process using the photoresist compositions of Examples 2 and 3 and Comparative Examples 2 and 3, respectively, a number of defects of the photoresist patterns, e.g., residues, was measured. The number of defects of the photoresist patterns on the wafer was evaluated by an ADI defect detector provided by KLA-Tencor. Co.

Figure 16:
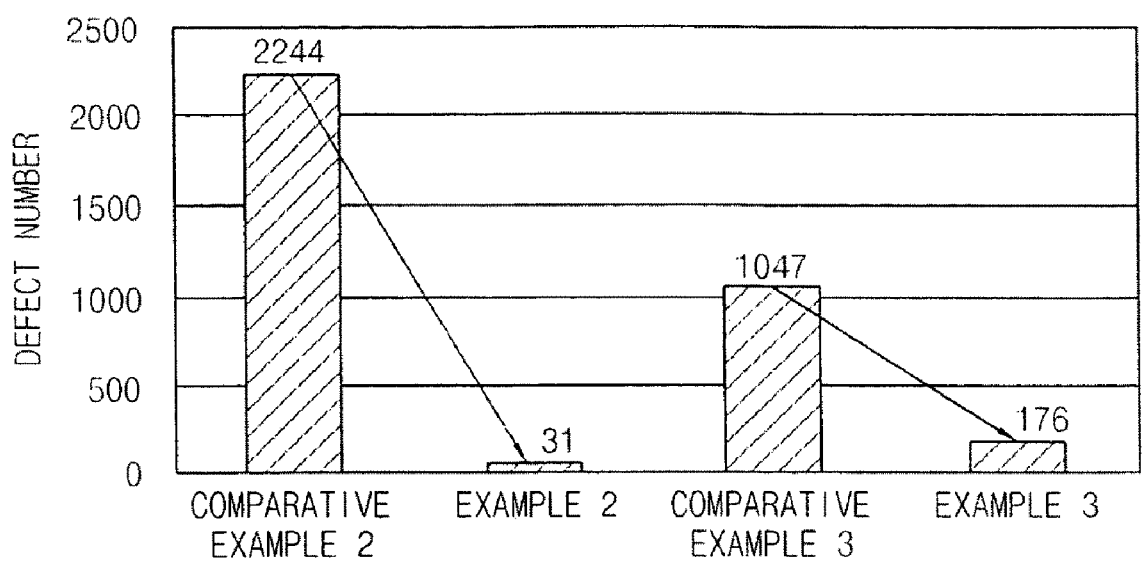
FIG. 16 illustrates a graph showing a number of defects of the first, second, third, and fourth photoresist patterns formed using the photoresist compositions of Examples 2 and 3 and Comparative Examples 2 and 3, respectively.

FIG. 16 illustrates a graph showing the number of defects of the first, second, third, and fourth photoresist patterns formed using the photoresist compositions of Examples 2 and 3 and Comparative Examples 2 and 3, respectively.

Referring to FIG. 16, the first photoresist pattern had a number of defects about 98% smaller than that of the third photoresist pattern. The second photoresist pattern had a number of defects about 83% smaller than that of the fourth photoresist pattern. Therefore, the photoresist patterns formed using the photoresist compositions including the additive may have improved quality regardless of the kinds of the photoresist composition.

The photoresist composition in accordance with an embodiment may include the polymer having a relatively large number of acid-labile protective groups. As a ratio of the acid-labile protective groups increases, the solubility rate difference between the exposed portion 14 and non-exposed portion 15 may increase so that the resolution of the photoresist pattern 17 may be improved.

The photoresist compositions in accordance with an embodiments may include the polymer including a relatively large amount of the acid-labile protective group. Thus, the photoresist pattern formed using the photoresist compositions may have an improved resolution because of the high solubility difference between the exposed portion and the non-exposed portion thereof.

When the amount of the acid-labile protective groups in the polymer becomes larger, the hydrophobicity of the photoresist film formed using the photoresist composition may increase; and residues of the photoresist composition may be generated by imperfect removal of the exposed portion of the photoresist film in a developing process or a rinsing process. However, the photoresist compositions in accordance with an embodiment may include the polymerized additives having high hydrophilicity, thereby having an improved dissolution rate in water or an alkali developer. Thus, the generation of the residues of the photoresist composition may be decreased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a pattern, the method comprising:
   forming a photoresist film on a substrate by coating a photoresist composition thereon, the photoresist composition including a polymerized photoresist additive, a polymer including an acid-labile protective group at a side chain, a photoacid generator, and a solvent;
   exposing the photoresist film; and
   forming a photoresist pattern by developing the photoresist film using an aqueous alkali developer,
   wherein the polymerized photoresist additive includes:
      a hydrophilic repeating unit having an aliphatic hydrocarbon backbone and a side chain containing an oxygen heteroatom in a heterocyclic ring substituted with at least three hydroxyl groups, and
      a hydrophobic repeating unit having an aliphatic hydrocarbon backbone and a side chain containing a fluorinated aliphatic hydrocarbon group.

2. The method as claimed in claim 1, wherein the polymerized photoresist additive is represented by Chemical Formula 1 or 2,

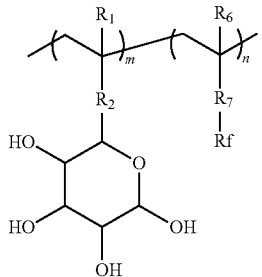

(1)

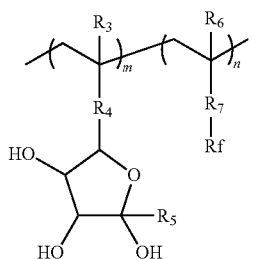

(2)

wherein, in Chemical Formulae 1 and 2, $R_1$, $R_3$, and $R_6$ are each independently hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group, $R_2$, $R_4$, and $R_7$ are each independently a divalent chain functional group including at least one of a $C_2$-$C_6$ carbonyloxyalkylene group, a $C_1$-$C_6$ alkylene group, a $C_1$-$C_6$ alkyleneoxy group, a $C_1$-$C_6$ oxyalkylene group, a $C_1$-$C_6$ carbonyl group, an oxy group, a $C_1$-$C_6$ carbonyloxy group, a $C_1$-$C_6$ oxycarbonyl group, a $C_2$-$C_6$ carbonylalkylene group, and a $C_2$-$C_6$ alkylenecarbonyl group, $R_5$ is hydrogen, a $C_1$-$C_4$ hydroxyalkyl group, a $C_1$-$C_4$ alkoxy group, or a $C_1$-$C_4$ alkyl group, Rf is a $C_1$-$C_4$ fluoroalkyl group, a $C_1$-$C_4$ perfluoroalkyl group, or an aliphatic hydrocarbon group having at least one of a fluoroalkyl group and a perfluoroalkyl group as a substituent group, and $0<m<1$, $0<n<1$, and $0<m+n\leq 1$.

3. The method as claimed in claim 1, wherein the polymerized photoresist additive is represented by Chemical Formula 3 or 4,

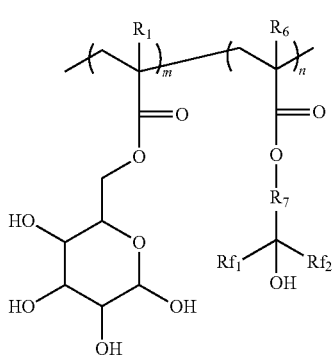

(3)

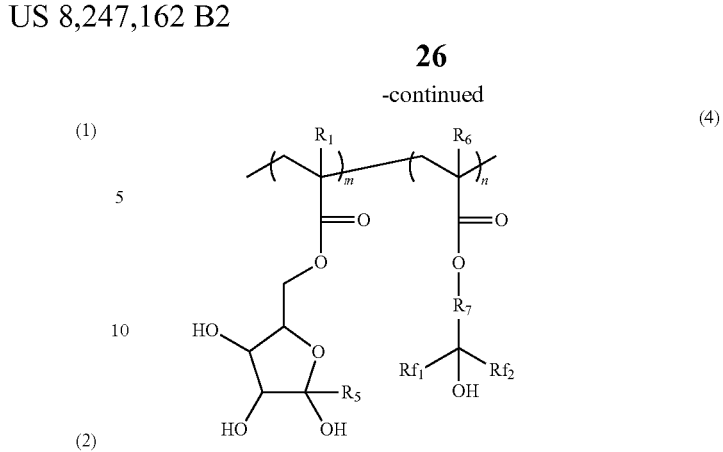

(4)

wherein, in Chemical Formulae 3 and 4, $R_1$ and $R_6$ are each independently hydrogen, a $C_1$-$C_4$ alkyl group, an alkoxy group, a haloalkyl group, or a hydroxyalkyl group, $R_5$ is hydrogen or a $C_1$-$C_4$ hydroxyalkyl group, $R_7$ is a $C_1$-$C_{10}$ alkylene chain, and $Rf_1$ and $Rf_2$ are each independently a $C_1$-$C_4$ fluoroalkyl or a $C_1$-$C_4$ perfluoroalkyl, and $0<m<1$, $0<n<1$, and $0<m+n\leq 1$.

4. The method as claimed in claim 1, wherein the hydrophilic repeating unit has a residue of an aliphatic polyol on the side chain, the residue including at least one of glucose, altrose, mannose, gulose, idose, galactose, talose, ribose, arabinose, xylose, licsose, and fructose.

5. The method as claimed in claim 1, wherein the polymerized photoresist additive is represented by Chemical Formula 5,

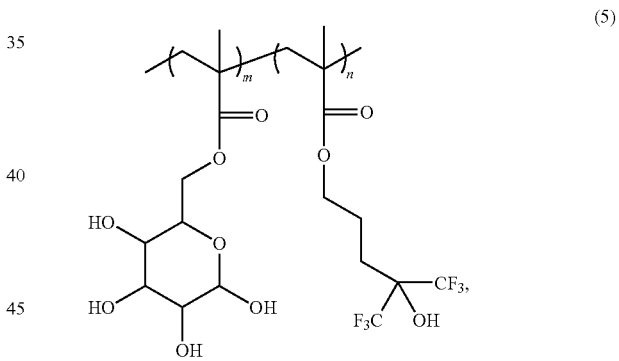

(5)

and $0<m<1$, $0<n<1$, and $0<m+n\leq 1$.

6. The method as claimed in claim 1, wherein the repeating units including the acid-labile protective group at the side chain are included in the polymer in an amount of about 30 mol % to about 60 mol %, based on a total mole number of repeating units of the polymer.

7. The method as claimed in claim 6, wherein the polymer includes a $C_5$-$C_{20}$ alicyclic hydrocarbon group unsubstituted or substituted with the acid-labile protective group, and the $C_5$-$C_{20}$ alicyclic hydrocarbon group includes at least one of substituted or unsubstituted adamantly, substituted or unsubstituted tricyclodecanyl, substituted or unsubstituted norvinyl, substituted or unsubstituted isobornyl, substituted or unsubstituted cyclopentyl, and substituted or unsubstituted cyclohexyl.

8. The method as claimed in claim 1, wherein the polymer includes a first repeating unit, a second repeating unit, and a third repeating unit, the first repeating unit having the acid-labile protective group at a side chain, the second repeating unit having a lactone ester group at a side chain, and the third repeating unit having an aliphatic hydrocarbon group substituted with hydroxyl group at a side chain.

9. The method as claimed in claim 1, further comprising forming an etch-target layer on the substrate prior to forming the photoresist film; and performing an etching process on the etch-target layer to form an etch-target layer pattern on the substrate using the photoresist pattern as an etching mask.

10. A photoresist composition, comprising:
a polymer including an acid-labile protective group at a side chain;
a photoacid generator;
a solvent; and
a polymerized photoresist additive including a repeating unit represented by Chemical Formula 1 or 2,

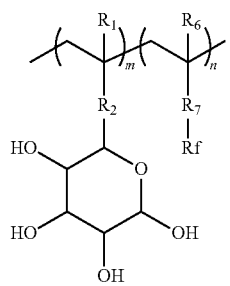

(1)

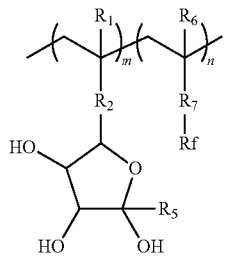

(2)

wherein, in Chemical Formulae 1 and 2, $R_1$, $R_3$, and $R_6$ are each independently hydrogen, a $C_1$-$C_4$ alkyl group, a $C_1$-$C_4$ alkoxy group, a $C_1$-$C_4$ haloalkyl group, or a $C_1$-$C_4$ hydroxyalkyl group, $R_2$, $R_4$, and $R_7$ are each independently a divalent chain functional group including at least one of a $C_2$-$C_6$ carbonyloxyalkylene group, a $C_1$-$C_6$ alkylene group, a $C_1$-$C_6$ alkyleneoxy group, a $C_1$-$C_6$ oxyalkylene group, a $C_1$-$C_6$ carbonyl group, an oxy group, a $C_1$-$C_6$ carbonyloxy group, a $C_1$-$C_6$ oxycarbonyl group, a $C_2$-$C_6$ carbonylalkylene group, and a $C_2$-$C_6$ alkylenecarbonyl group, $R_5$ is hydrogen, a $C_1$-$C_4$ hydroxyalkyl group, a $C_1$-$C_4$ alkoxy group, or a $C_1$-$C_4$ alkyl group, and Rf is a $C_1$-$C_4$ fluoroalkyl group, a Ci-C4 perfluoroalkyl group, or an aliphatic hydrocarbon having at least one of a fluoroalkyl group or a perfluoroalkyl group as a substituent group, and $0 < m < 1, 0 < n < 1$, and $0 < m+n \leq 1$.

* * * * *